METHOD OF MAKING CRYSTALLINE SILICON SEMICONDUCTOR MATERIAL

Filed March 18, 1955 2 Sheets-Sheet 1

INVENTORS
ANDRE R. GOBAT
DANIEL I. POMERANTZ
BY Henry Kolin
AGENT

METHOD OF MAKING CRYSTALLINE SILICON SEMICONDUCTOR MATERIAL

Filed March 18, 1955

INVENTORS
ANDRE R. GOBAT
DANIEL I. POMERANTZ
BY Henry Kolin
AGENT

United States Patent Office 3,173,765
Patented Mar. 16, 1965

3,173,765
METHOD OF MAKING CRYSTALLINE SILICON SEMICONDUCTOR MATERIAL

Andre R. Gobat, North Caldwell, and Daniel I. Pomerantz, Nutley, N.J., assignors to International Telephone and Telegraph Corporation, Nutley, N.J., a corporation of Maryland Filed Mar. 18, 1955, Ser. No. 495,082
5 Claims. (Cl. 23—301)

This invention relates to semiconductor devices and to methods for making them. It is more particularly directed to semiconductor devices comprising silicon monocrystals and to methods for growing such crystals.

Semiconductor devices, such as crystal diodes and crystal triodes or transistors, commonly employ crystals of various chemical elements and compounds for the semiconductor material. Germanium and silicon, either in the pure state or alloyed with other elements, are particularly important as semiconductors for use in such devices. Semiconductor devices employing silicon are additionally important and useful in being able to maintain stable electrical characteristics when such devices are operated at elevated temperatures. This high-temperature stability of silicon follows from its relatively high intrinsic energy gap, that is, the number of electron volts required to raise an electron of the silicon atom in the lattice from its valence state to its conductivity state or band.

It has been found that in order to obtain silicon-containing semiconductor devices having reproducible properties, satisfactory reliability and reasonably satisfactory electrical characteristics, such as gain, noise figure, frequency range and power, the silicon used should preferably be of a high degree of purity. It has furthermore been found that for most applications in order to obtain silicon diodes and triodes of high quality, the silicon used should be obtained from a single crystal of silicon, that is, silicon with no intercrystalline boundaries present. This is because a single crystal of a substance will contain fewer impurities than multicrystalline material; with the latter there is a greater opportunity for unwanted impurities to become lodged between irregularly small crystal grains than to become crystallized as part of a single crystal. The use of silicon single crystals is particularly important in the preparation of various types of silicon crystal triodes, such as point-contact transistors and junction transistors.

For certain specialized semiconductor devices it is important that a controlled crystalline boundary be produced in the growing of the monocrystal. Thus while monocrystalline silicon material is of importance in conventional semiconductor devices, other such devices may require twinned crystals produced in a controlled manner. For example, the twinning plane, i.e., the boundary between the twins, represents an area over which diffusion of solid impurities occurs at an enhanced rate. By this enhanced diffusion, p-n and n-p-n junctions may be created, resulting in novel types of junction diodes and transistors. By twinning, reference is made to the process of producing a compound crystal composed of two or more crystals or parts of crystals in mirror image position with reference to each other, having a common boundary.

Various methods have been proposed and used for the growing of single crystals. One such known technique is referred to as the zone-melting method. In this method a crystalline bar, usually maintained in a horizontal position, is passed through heaters and thereby a molten zone is made to traverse the crystalline material. A seed of a monocrystal may be attached to one end of the bar so as to produce a single crystal using this technique. Where the crystalline ingot is of silicon, the high temperature required for the zone melting makes for considerable difficulty in temperature control. The equipment used is elaborate and expensive. The process does not result in the obtaining of satisfactorily uniform single crystals unless the control techniques used are of a highly precise nature. Furthermore, crystals obtained by the zone-melting method frequently have considerable strains and imperfections in their internal structure. This results in a lowered life-time of minority carriers present in the crystal.

Another method used for preparing single crystals is known as Czochralski's technique. In this method, frequently referred to as the crystal-pulling technique, a seed crystal is dipped into a molten mass of material, and the surface of solidification of the crystal is gradually advanced from the seed crystal to the molten substance. It is apparent that in growing single crystals using such a method, lowering the crucible with the seed held fixed is equivalent to raising the seed holder with the crucible maintained in place.

Where the crystal-pulling technique has been used for the growing of silicon single crystals, it has been found that the obtaining of single crystals of silicon is adventitious and haphazard. Thus, most often, despite the most elaborate of precautions taken, multicrystalline material is obtained. Where silicon monocrystals are occasionally obtained, the results are not uniform or reproducible.

Because of the foregoing, it has been difficult to prepare, in a uniform and reproducible manner, semiconductor devices, such as crystal diodes and transistors, wherein the semiconductor element is single-crystal silicon. Therefore, a considerable need has existed for a simple, convenient, rapid, precise, economically feasible and above all reliable and reproducible method for obtaining single-crystal, i.e., monocrystalline, silicon of uniform purity.

It is an object of the present invention to provide semiconductor devices using single-crystal silicon prepared in accordance with this invention.

It is a further object to provide a novel method for preparing single-crystal silicon by the pulling-crystal technique.

It is still a further object of this invention to provide a simple, convenient and reproducible method, requiring no elaborate programming arrangement, for obtaining single-crystal silicon.

It is still an additional object to provide a simple method for producing controlled twinning in silicon monocrystals.

Other objects of this invention will become apparent from the following figures and description, wherein.

It is a feature of this invention that silicon monocrystals are prepared by melting silicon in a container of material which is substantially inert to molten silicon and then growing the silicon monocrystal in a chamber which is completely free of carbon, gaseous carbon compounds or any carbon compounds capable of yielding gaseous carbon compounds. It is the essence of this invention that in growing the single crystal of silicon the surface of the molten silicon is maintained free from contact with any gaseous carbon compounds.

It is an additional feature of this invention that to obtain controlled twinning, a minute quantity of a gaseous carbon compound is momentarily introduced to the surface of the molten silicon at the time that a crystalline boundary is desired in the silicon crystal.

Figure 1:
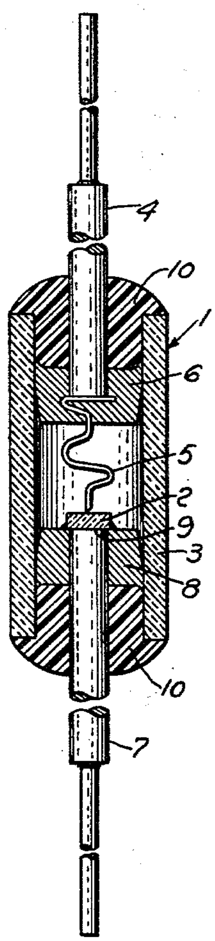
FIG. 1 is a sectional view of a crystal diode using single-crystal silicon of this invention.

Referring to FIG. 1, a crystal diode 1 is shown in which the semiconductor 2 consists of single-crystal silicon produced in accordance with the principles of this invention. Such a semiconductor diode utilizing this type of single-crystal silicon is extremely reliable in its electrical characteristics, particularly at elevated temperatures as compared with the more conventional diodes using multicrystalline silicon or single-crystal or multicrystalline germanium. The diode tube 3 may consist of any rigid insulating material, preferably an unglazed, non-porous, ceramic tube. The whisker plug assembly unit comprises a support pin 4 preferably made of nickel, joined to an S-shaped point contact wire 5, preferably made of platinum or of platinum-ruthenium alloy. This whisker electrode 5 and metallic pin 4 are held together in rigid relationship to one another by a body of metal 6, such as a lead-antimony alloy. For the assembly designated as the crystal plug assembly, a support pin 7, preferably of nickel, is comolded with a metal 8 of the same composition as used for the metal 6. To the end of this support pin 7 the single crystal silicon die or slab 2 is attached. This silicon semiconductor, either before or after being diced to proper dimensions, may be etched or similarly treated to produce desired surface characteristics. By using monocrystalline material for the semiconductor it is apparent that a certain latitude will exist with respect to the specific location of the whisker point on the semiconductor surface without affecting the electrical properties of the assembled crystal diode. The semiconductor 2 may be attached to the support pin 7 in any of several manners, such as welding, soldering or by the use of conductive cement 9. After the whisker plug and crystal plug assemblies have been force fitted into the ceramic tube under pressure and suitable electrical contact made, the tube is end-sealed. Measured amounts of polyethoxyline type cement 10 may be used for this sealing.

While the use of single-crystal silicon produced in accordance with the principles of this invention has been illustrated as the semiconductor element of a point-contact crystal diode, it is readily apparent that other semiconductor devices may equally well be prepared using the single-crystal silicon of this invention. Thus, junction diodes and point-contact and grown-junction triodes may be prepared wherein the single-crystal silicon contains controlled amounts of impurities added to impart desired n-type or p-type conductivity.

Figure 2:
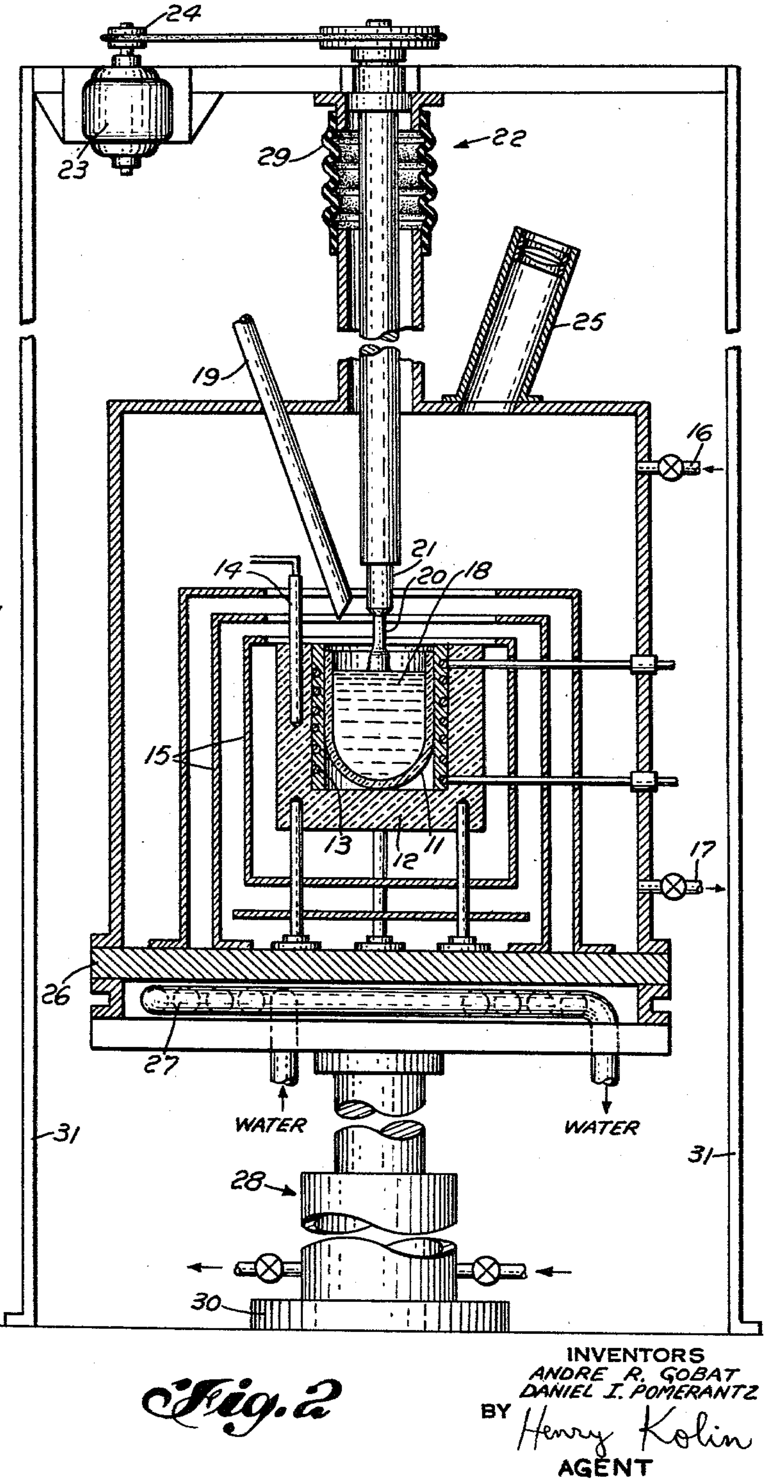
FIG. 2 is an elevational view partly shown in cross section of an apparatus for growing uniform single crystals by the crystal-pulling technique.

In FIG. 2 is illustrated a suitable apparatus for preparing monocrystalline silicon in accordance with the principles of this invention. The bulk of silicon to be grown into a single crystal or monocrystal is placed in a suitable container 11 made of a material which is substantially inert to molten silicon. Refractory materials such as quartz, alumina, titania, beryllia and the like which do not react substantially with the silicon are considered suitable. In general, a crystal-clear, optical-grade, high-purity fused quartz crucible is preferred for containing the silicon. While such a crucible may contain traces of boron, magnesium, aluminum, copper, silver and calcium, we have found that the presence of these trace elements, normally present in high-purity optical-grade quartz, does not interfere with the growing of single crystals of silicon. It is, however, absolutely essential that a graphite crucible not be used as such a material is reactive with silicon, contaminates it and prevents the growing of single crystals therein. The molten material in the quartz crucible is maintained at a constant temperature slightly above its melting point by a small furnace 12, containing resistance coil heaters 13. It is essential for the practice of this invention that the refractory material comprising the walls of the furnace 12 not be made of graphite or of any carbon-containing material which can yield gaseous carbon compounds. A refractory material such as aluminum oxide is satisfactory for this purpose. Molybdenum is a suitable material for the coil heaters 13. The heating element may be prepared by winding a molybdenum heater coil inside of a vertical fused alumina tube and covering this with a thin layer of fused alumina cement. The proprietary material known as Alundum is considered a satisfactory fused alumina refractory in this regard. Thermocouple 14, made of platinum-platinum rhodium, is inserted within the walls of furnace 12 to regulate and control the temperature of the furnace. Thereby the desired temperature of the molten material is maintained within very close thermal limits. To further minimize variations in temperature, baffle shields 15, preferably in the form of a series of concentric molybdenum cylinders, surround the furnace and quartz crucible. An atmosphere containing an inert gas, such as helium, neon or nitrogen, or a noncarbonaceous reducing gas, such as hydrogen, may be maintained about the molten material by flowing a stream of the gas through the enclosure by way of gas inlet tube 16 and gas outlet tube 17. To the molten material 18 contained in the crucible 11 may be added desired amounts of various solute atoms, such as boron, by means of feeding tube 19.

To start crystal growth, a seed 20 of pure single-crystal silicon is used. This seed is composed of substantially the same material as that in the molten charge 18 contained within the quartz crucible 11. This seed attached to a crystal holder 21 is lowered to contact the surface of the small pool of molten silicon 18 contained in the quartz crucible 11, and a crystal is grown therefrom. During the process of crystal growth the crystal holder 21 is rotated by the mechanical arrangement 22 comprising a motor 23, pulley 24 and associated components at a speed of approximately 100 revolutions per minute (r.p.m.). The progress of the crystal growth is visually followed through the optical tube 25. The platen 26 supporting the furnace 12 is preferably water cooled by means of water circulating through the coils 27. In the Czochralski crystal-pulling technique the seed making contact with the molten material is gradually withdrawn from this molten material at a uniform rate allowing the molten material to crystallize onto the seed, the region located just above the molten material being at a temperature slightly below the melting temperature of the silicon. To facilitate the maintenance of this differential in temperature between the molten silicon and the seed, the crystal holder may be air- or water-cooled. It is apparent that in effecting this separation between the seed and the molten material it is of little consequence for the growth of the crystal whether the seed moves away from the molten material, the molten material remaining stationary, or whether the crucible is lowered, the seed remaining in a fixed position. In either procedure an increasing separation occurs between the seed and the molten material from which the crystal is growing. It has been found a matter of convenience to start crystal growth by lowering the crucible by means of a hydraulic arrangement 28 which thereby lowers the furnace crucible and associated equipment. A flexible bellows arrangement 29 allows for the lowering of the furnace without impairing the gas-tight arrangement. The base 30 of the hydraulic jack is attached to the framework 31 which also supports the crystal rotating arrangement 22.

Figures 3, 3A, 4, 4A, 5, 5A, 6, 6A, 7, 7A, 8, 8A:
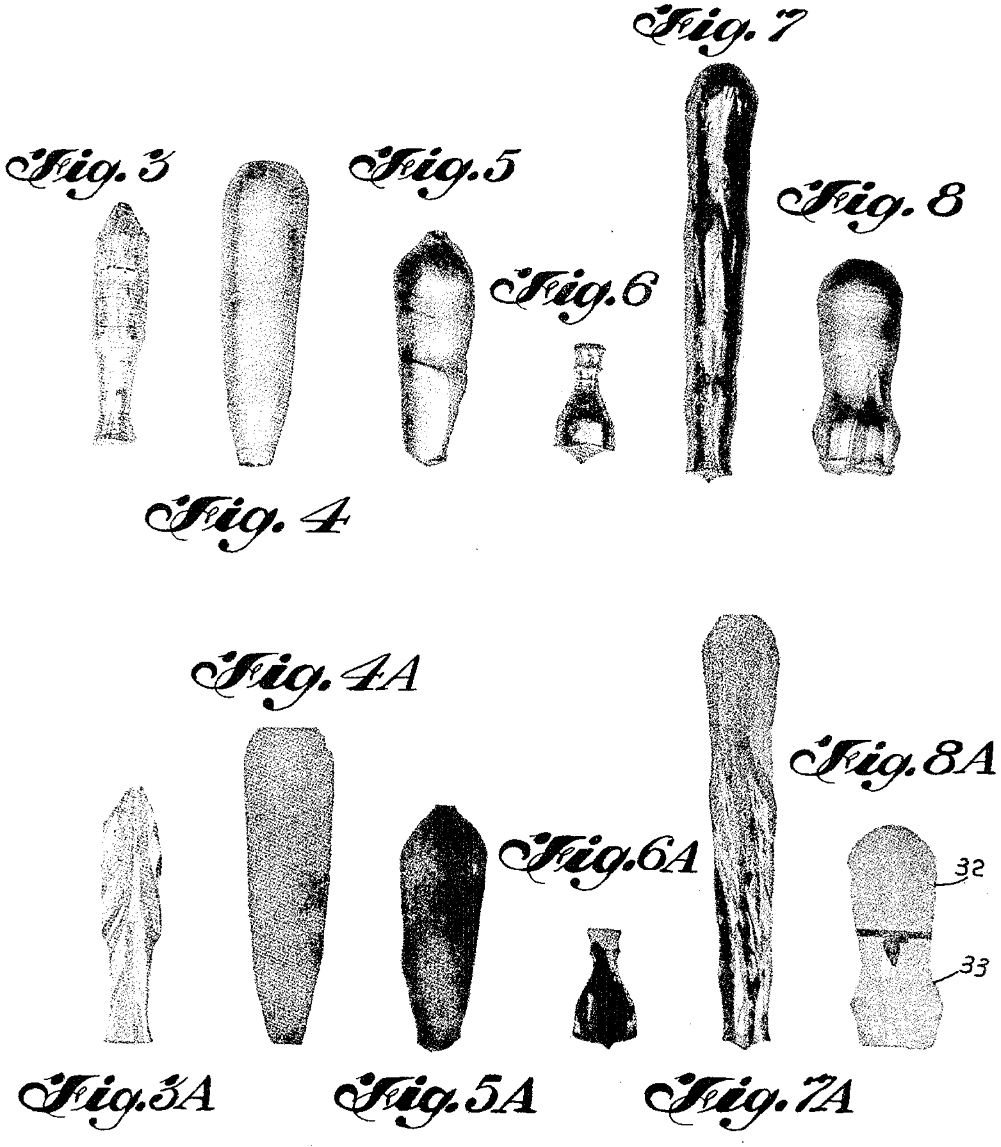
FIGS. 3 and 3A are elevational and cross sectional views, respectively, of multicrystalline silicon.
FIGS. 4 and 4A are elevational and cross-sectional views, respectively, of single-crystal silicon grown in accordance with this invention.
FIGS. 5 and 5A are elevational and cross-sectional views, respectively, of an additional sample of single-crystal silicon grown in accordance with this invention.
FIGS. 6 and 6A are elevational and cross-sectional views, respectively, of multicrystalline silicon obtained by eliminating a novel feature of this invention.
FIGS. 7 and 7A are elevational and cross-sectional views, respectively, of additional specimens of multicrystalline silicon obtained by eliminating a novel feature of this invention.
FIGS. 8 and 8A are elevational and cross-sectional views, respectively, of a twinned crystal of silicon produced in accordance with the principles of this invention.

In FIGS. 3 and 3A are shown elevational and cross-sectional views, respectively, of a sample of multicrystalline silicon grown from a melt by means of the Czochralski crystal-pulling technique. The molten silicon was a sample of high purity Du Pont silicon contained in a quartz crucible which was placed inside of a graphite container. Such a method is commonly employed for crystal growing, the outer graphite container serving as a susceptor for induction heating, and is illustrated, for example, in U.S. Patent 2,402,661.

Upon eliminating the graphite container, and using a similar sample of high-purity Du Pont silicon in a quartz crucible, the single-crystal silicon shown in FIGS. 4 and 4A, in elevational and cross-sectional views, respectively, was obtained. Where silicon from another source of supply was used, and again the graphite crucible was eliminated and the silicon was grown in an environment wherein the surface of the molten silicon was maintained free from contact with gaseous carbon compounds, single-crystal silicon was obtained, as illustrated in the elevational and cross-sectional views shown in FIGS. 5 and 5A.

It has thus been found that when precautions are taken to eliminate the presence of graphite or carbon in any form in any of the equipment used, whether it be in the crucible in contact with the silicon itself or as an outer container for the quartz crucible or as a support rod within the chamber or as a susceptor for induction heating or in any form whatsoever, single crystals of silicon as illustrated in FIGS. 4 and 5 may be regularly and reliably produced. However, if carbon is present anywhere within the container, it is found that single-crystal silicon cannot be obtained or at best is obtained haphazardly and randomly. It has been found, for example, that where a small piece of carbon was placed in contact with the outside surface and on the bottom of the quartz crucible and a crystal pulling experiment started, crystals grown using this arrangement were multicrystalline and had the characteristic appearance illustrated in FIG. 6. The cross-sectional view, shown in FIG. 6A, clearly confirmed the multicrystalline structure. On dipping the seed into the melt during the crystal-growing process, it was observed that some dross formed on the surface which apparently did not cling to the seed but migrated to the edge of the liquid meniscus. This dross did not disappear with time. Moreover, although the seed was apparently free from dross it was not possible to grow even a short portion of monocrystalline material. This dross was considered to be a carbonaceous product.

To further confirm the deleterious effects of the presence of any carbon within the chamber, a small ring of carbon was suspended below the bottom of the crucible with three fine tungsten wires. The ring was nowhere in contact with the quartz crucible and any transfer of carbon to the silicon in the crucible had to take place via the gas phase. A crystal-pulling experiment was started, and once again dross was formed which did not disappear. Again the resulting crystal illustrated in FIG. 7, was multicrystalline, as is clearly shown by its cross section, illustrated in FIG. 7A.

In view of this unexpected and surprising discovery that the mere presence of carbon anywhere within the chamber interfered with the growth of single-crystal silicon and resulted in the production of multicrystalline silicon, further experiments were performed to determine whether this phenomenon could be utilized to produce controlled twinning in silicon. For certain applications the presence of a controlled crystal boundary within the silicon crystal is highly useful, resulting in novel p-n and n-p-n junctions. It was found that a crystal which was characteristically monocrystalline in appearance was obtained when a silicon crystal was pulled from a quartz crucible. No carbon was used anywhere inside the crystal grower and helium was passed into the growing chamber during this operation. After having grown about one-third of the available melt a small amount of carbon monoxide gas was slowly bled into the helium supply line feeding the crystal grower. This addition of carbon monoxide gas did not produce any immediately apparent effect upon the crystallization process. No visible dross was formed, and the crystal formation did not seem affected. However, upon continuing the crystal-pulling operation further, it became apparent that some twinning must have occurred because the shape of the lower portion of the crystal was quite different from that of the upper half. Examination of the crystal, shown in FIG. 8, showed that its cross section was as illustrated in FIG. 8A. The upper portion 32 of the crystal was monocrystalline, and the lower portion 33 was multicrystalline. As illustrated in FIG. 8A, the transition or transformation junction between the two formations was sharp, and the degree of disorder in the lower half was much more pronounced than in instances where uncontrolled spurious twinning took place. Apparently, as little as 10 parts by weight carbon per million parts silicon will result in twinning, depending upon associated factors of gas flow, growing rate and the like.

While not being restricted to the explanation proposed, it is believed that the presence of graphite anywhere within the browing chamber prevents the growth of single-crystal silicon because of the formation of gaseous carbon compounds, such as carbon monoxide and carbon dioxide. This is believed to take place because of the following. First there is the well-known reaction which occurs at a slow but continuous rate between molten silicon and the quartz crucible during crystal melting and pulling.

$$\text{Si (melt)} + \text{SiO}_2 \text{ (crucible)} = 2\text{SiO (gas)}$$

The formation of gaseous silicon monoxide does not directly interfere with the formation of silicon monocrystals. Thus for the purposes of this invention, quartz may be considered as substantially non-reactive with silicon. The silicon monoxide gas produced in the above reaction is capable of reacting with any hot graphite present yielding silicon carbide and carbon monoxide gas as illustrated in the following equation:

$$\text{SiO (gas)} + 2\text{C (graphite)} = \text{SiC (S)} + \text{Co (gas)}$$

The carbon monoxide then diffuses to the surface of the melt and reacts with molten silicon yielding either silicon carbide or some other insoluble carbonaceous reaction product. These insoluble products will promote spurious nucleation. However, by introducing a controlled quantity of a carbonaceous gas, such as carbon monoxide, at a desired point in the crystal growing process, controlled twinning may be obtained. Furthermore, by addition of controlled amounts of carbon monoxide or the like, various controlled concentrations of dislocations may be produced in the growing silicon crystal.

While we have described above the principles of our invention in connection with specific devices and method steps, it is to be clearly understood that this description is made only by way of example and not as a limitation to the scope of our invention as set forth in the objects

We claim:

1. A method for preparing a silicon crystal having two distinct crystalline formations with a transformation junction therebetween comprising melting a mass of silicon in a container of material which is substantially inert to molten silicon, maintaining said molten mass at a temperature above the melting point of silicon in a chamber all portions of which are formed of material free of carbon and containing an atmosphere free from carbon and carbon compounds, placing a seed crystal of silicon in contact with said molten silicon, and progressively separating said seed crystal from said molten silicon at a rate whereby molten silicon adherent to said seed crystal progressively crystallizes to form a monocrystalline formation and introducing into said chamber at a desired transformation point a gaseous carbon compound to thereafter form a multicrystalline formation on said crystal.

2. A method according to claim 1 wherein said gaseous carbon compound comprises carbon monoxide gas.

3. A method according to claim 1 wherein an inert atmosphere is maintained in said chamber by flowing a stream of helium gas through said chamber, and wherein at a desired transformation point carbon monoxide gas is introduced into the helium stream for introduction into said chamber.

4. A method according to claim 1 wherein said gaseous carbon compound comprises by weight 10 parts of carbon per million parts of silicon present.

5. A method for preparing a silicon crystal having controlled concentrations of crystalline dislocations therein comprising melting a mass of silicon in a container of material which is substantially inert to molten silicon, maintaining said molten mass at a temperature above the melting point of silicon in a chamber all portions of which are formed of material free of carbon and containing an atmosphere free from carbon and carbon compounds, placing a seed crystal of silicon in contact with said molten silicon, and progressively separating said seed crystal from said molten silicon at a rate whereby molten silicon adherent to said seed crystal progressively crystallizes to form a monocrystalline formation and introducing into said chamber at regions of desired crystalline dislocations within said crystal controlled quantities of a gaseous carbon compound to form said concentrations of crystalline dislocations.

References Cited in the file of this patent

UNITED STATES PATENTS

| | | |
|---|---|---|
| 2,402,582 | Scaff | June 25, 1946 |
| 2,625,592 | Sueur et al. | Jan. 13, 1953 |
| 2,631,356 | Sparks et al. | Mar. 17, 1953 |
| 2,649,560 | Blair | Aug. 18, 1953 |
| 2,686,212 | Horn | Aug. 10, 1954 |
| 2,693,556 | Gahagan | Nov. 2, 1954 |
| 2,694,024 | Bond | Nov. 9, 1954 |
| 2,703,856 | Powers et al. | Mar. 8, 1955 |
| 2,727,840 | Teal | Dec. 20, 1955 |